United States Patent
Watabe et al.

(10) Patent No.: US 10,756,223 B2
(45) Date of Patent: Aug. 25, 2020

(54) MANUFACTURING METHOD OF SOLAR CELL WITH HIGH PHOTOELECTRIC CONVERSION EFFICIENCY AND SOLAR CELL WITH HIGH PHOTOELECTRIC CONVERSION EFFICIENCY

(71) Applicant: SHIN-ETSU CHEMICAL CO., LTD., Tokyo (JP)

(72) Inventors: Takenori Watabe, Annaka (JP); Ryo Mitta, Annaka (JP); Hiroshi Hashigami, Annaka (JP); Hiroyuki Ohtsuka, Karuizawa-machi (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 0 days.

(21) Appl. No.: 16/063,759

(22) PCT Filed: Oct. 14, 2016

(86) PCT No.: PCT/JP2016/004584
§ 371 (c)(1),
(2) Date: Jun. 19, 2018

(87) PCT Pub. No.: WO2018/069951
PCT Pub. Date: Apr. 19, 2018

(65) Prior Publication Data
US 2019/0165191 A1 May 30, 2019

(51) Int. Cl.
*H01L 31/0352* (2006.01)
*H01L 31/0224* (2006.01)
(Continued)

(52) U.S. Cl.
CPC ......... *H01L 31/03529* (2013.01); *H01L 31/022425* (2013.01); *H01L 31/022441* (2013.01);
(Continued)

(58) Field of Classification Search
CPC ....... H01L 31/03529; H01L 31/022425; H01L 31/022441; H01L 31/0504; H01L 31/18; H01L 31/1876
See application file for complete search history.

(56) References Cited

U.S. PATENT DOCUMENTS

2012/0223046 A1   9/2012  Galiazzo et al.
2013/0087192 A1*  4/2013  Kim ............... H01L 31/022441
                                                        136/256
(Continued)

FOREIGN PATENT DOCUMENTS

CN    103219237 A    7/2013
JP    H05-235387 A    9/1993
(Continued)

OTHER PUBLICATIONS

Oerlikon Solar Ltd., Heather Booth, Laser Processing in Industrial Solar Module Manufacturing, Journal of Laser Micro/Nanoengineering, vol. 5, No. 3, pp. 183-191 (Year: 2010).*

(Continued)

*Primary Examiner* — Jayne L Mershon
(74) *Attorney, Agent, or Firm* — Oliff PLC

(57) ABSTRACT

A method for manufacturing a solar cell having preparing a semiconductor substrate having a dielectric film on at least a first main surface, partially removing the dielectric film of the semiconductor substrate, and forming an electrode along a region where the dielectric film is partially removed, including measuring relative positional relationship between a position of a region where the dielectric film is partially removed and a position of the formed electrode in the semiconductor substrate after partially removing the dielectric film and forming the electrode, wherein for a newly prepared semiconductor substrate having a dielectric film on at least a first main surface, the dielectric film is partially removed after adjusting a position of a region based on the
(Continued)

measured positional relationship. This improves the yield ratio of the solar cell by reducing positional displacement between the region where the dielectric film is partially removed and the electrode.

6 Claims, 14 Drawing Sheets

(51) Int. Cl.
*H01L 31/18* (2006.01)
*H01L 31/05* (2014.01)

(52) U.S. Cl.
CPC .......... *H01L 31/0504* (2013.01); *H01L 31/18* (2013.01); *H01L 31/1876* (2013.01); *Y02E 10/50* (2013.01); *Y02P 70/521* (2015.11)

(56) References Cited

U.S. PATENT DOCUMENTS

| | | | |
|---|---|---|---|
| 2015/0056742 A1* | 2/2015 | Rana | H01L 31/02167 438/71 |
| 2015/0221792 A1 | 8/2015 | Deshpande et al. | |
| 2018/0062012 A1 | 3/2018 | Yoshikawa et al. | |

FOREIGN PATENT DOCUMENTS

| | | |
|---|---|---|
| JP | 2006-332273 A | 12/2006 |
| JP | 2011-187467 A | 9/2011 |
| JP | 2013-232607 A | 11/2013 |
| JP | 2014-112600 A | 6/2014 |
| JP | 2014-168047 A | 9/2014 |
| JP | 2015-118979 A | 6/2015 |
| JP | 2015118979 * | 6/2015 |
| WO | 2011/026892 A1 | 3/2011 |
| WO | 2011/108476 A1 | 9/2011 |
| WO | 2013/125036 A1 | 8/2013 |
| WO | 2014/137283 A1 | 9/2014 |
| WO | 2015/130989 A1 | 9/2015 |
| WO | 2016/158977 A1 | 10/2016 |

OTHER PUBLICATIONS

Feb. 5, 2019 Japanese Office Action issued in Patent Application No. 2018-021159.
May 9, 2019 Extended European Search Report in European Patent Application No. 16880184.3.
Jan. 17, 2017 International Search Report issued in Patent Application No. PCT/JP2016/004584.
Jul. 11, 2017 Office Action issued in Japanese Patent Application No. 2017-519720.
Oct. 31, 2017 Office Action issued in Japanese Patent Application No. 2017-519720.
Jan. 17, 2017 Written Opinion of the International Searching Authority issued in Patent Application No. PCT/JP2016/004584.
Jan. 25, 2018 Office Action and Search Report issued in Taiwan Patent Application No. 105143635.

* cited by examiner (a)          (b)

FIG.7
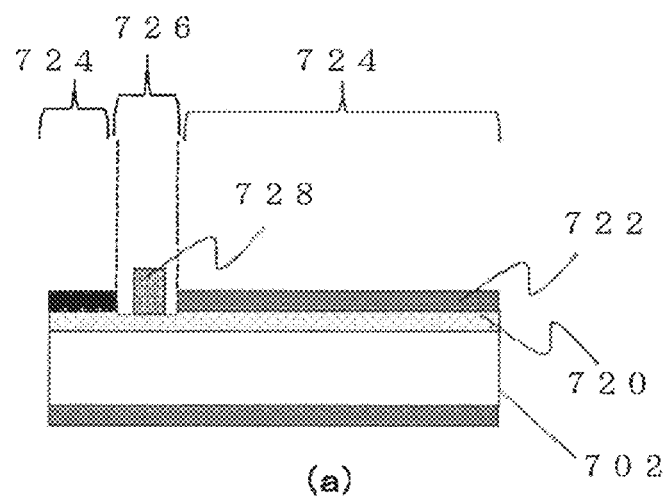
(a)
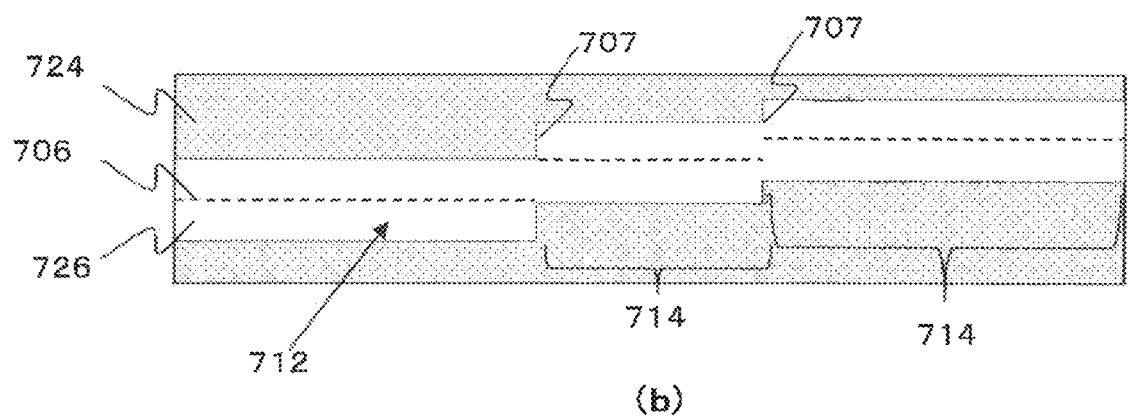
(b)

MANUFACTURING METHOD OF SOLAR CELL WITH HIGH PHOTOELECTRIC CONVERSION EFFICIENCY AND SOLAR CELL WITH HIGH PHOTOELECTRIC CONVERSION EFFICIENCY

TECHNICAL FIELD

The present invention relates to a manufacturing method of a solar cell with high photoelectric conversion efficiency and the solar cell with high photoelectric conversion efficiency.

BACKGROUND ART

As one of structures of a solar cell having relatively high photoelectric conversion efficiency using a single-crystal or polycrystalline semiconductor substrate, there is a back surface electrode type solar cell in which all of positive electrodes and negative electrodes are provided on a non-light receiving surface (back surface). FIG. 1 illustrates an overview of the back surface of the back surface electrode type solar cell. Emitter layers 102 and base layers 101 are alternatively arranged, and electrodes (103, 104) are provided on the layers along the respective layers. The emitter layer has a width of several mm to several hundred μm, and the base layer has a width of several hundred μm to several ten μm. Further, the electrode typically has a width of approximately several hundred to several ten μm, and the electrode is often referred to as a finger electrode.

FIG. 9 illustrates a schematic diagram of a cross-sectional structure of the back surface electrode type solar cell. In the vicinity of an outermost layer of a back surface of a substrate 202, the emitter layers 102 and the base layers 101 are formed. The thickness of each layer is at most approximately 1 μm. The finger electrodes (205, 206) are provided on the respective layers, and the surface of a non-electrode region is covered with a back surface protective coat 207 such as a silicon nitride film and a silicon oxide film. An antireflective coat 201 is provided on a light receiving surface side for the purpose of reducing reflectance loss.

CITATION LIST

Patent Literature

[Patent Document 1] Japanese Unexamined Patent Application Publication (Kokai) No. 2006-332273

SUMMARY OF INVENTION

Technical Problem

One of problems in manufacturing process of a back surface electrode type solar cell is displacement between a base layer and a base electrode. Because stretch of a plate changes over time or for each plate making an the case where an electrode is formed using a printing method, it has been extremely difficult to stably form an electrode having a width of several hundred to several ten pm along the base layer having a width of several hundred pm to several ten μm as described above. While broadening the width of the base layer is the easiest way to reduce this displacement in terms of manufacturing process, it is publicly known as disclosed in, for example, Patent Document 1 that if the width of the base layer is broadened, conversion efficiency is reduced. Considering the manufacturing cost, the printing method is the most effective, and it has been necessary to establish a method for forming an electrode with a good yield ratio using the printing method while maintaining the width of the base layer.

The present invention has been made in view of the problem, and it is an object of the present invention to provide a manufacturing method of a solar cell with high photoelectric conversion efficiency which can improve a manufacturing yield ratio of the solar cell by reducing displacement between a base layer and a base electrode. Further, it is an object of the present invention to provide a solar cell with high photoelectric conversion efficiency and with good characteristics, in which displacement between a base layer and a base electrode is small. Still further, it is an object of the present invention to provide a solar cell manufacturing system which can improve a manufacturing yield ratio of the solar cell by reducing displacement between a base layer and a base electrode.

Solution to Problem

To achieve the objects, the present invention provides a method for manufacturing a solar cell which includes preparing a semiconductor substrate having a dielectric film on at least a first main surface, partially removing the dielectric film of the semiconductor substrate and forming an electrode along a region where the dielectric film is partially removed, the method for manufacturing a solar cell including measuring relative positional relationship between a position of the region where the dielectric film is partially removed and a position of the formed electrode for the semiconductor substrate after partially removing the dielectric film and forming the electrode, and, for a newly prepared semiconductor substrate having a dielectric film on at least a first main surface, the dielectric film being partially removed after a position of a region where the dielectric film is to be partially removed is adjusted based on the measured positional relationship.

In this manner, instead of correcting positional displacement of an electrode to be formed in plane, by correcting displacement such that a position of a region where a dielectric film is to be removed is aligned with the electrode based on relative positional relationship between the position of the region where the dielectric film is partially removed and the position of the electrode, it is possible to simply and easily reduce displacement of the relative positional relationship, that is, positional displacement, so that it is possible to improve a yield ratio of the solar cell while improving productivity. Further, instead of performing adjustment of the position after performing measurement separately and respectively at the electrode and the region where the dielectric film is removed, by performing adjustment by observing the substrate in which the electrode is actually formed in the region where the dielectric film is removed, it is possible to reduce factors of variation.

At this time, it is preferable to measure relative positional relationship for each selected coordinate in a plane of the semiconductor substrate and to adjust the Position of the region where the dielectric film is to be partially removed for each selected coordinate.

Because positional displacement in the case where an electrode is formed in a region where the dielectric film is removed occurs in a plane with reproducibility and with high probability, by obtaining a coordinate at a point at which positional displacement occurs and adjusting the position of the region where the dielectric film is to be partially removed for each coordinate, it is possible to easily and effectively reduce positional displacement.

Further, it is preferable to divide a plane of the semiconductor substrate into a plurality of regions, allocating a coordinate representing the region for each of the divided regions, to measure the relative positional relationship for each coordinate allocated to each of the divided regions and to adjust a position of a region where the dielectric film is to be partially removed for each allocated coordinate.

In this manner, by dividing the plane of the semiconductor substrate into a plurality of regions, allocating a coordinate representing the region for each region and measuring the relative positional relationship and adjusting the position of the region where the dielectric film is to be partially removed at these coordinates, it is possible to thin out the number of points to be measured to some extent. By this means, it is possible to improve productivity and efficiently manufacture a solar cell. It should be noted that because it is considered that systematic positional displacement in the case where an electrode is formed in a region where the dielectric film is removed continuously changes, it is not always necessary to measure the positional relationship by observing all the electrodes.

Further, it is preferable to measure the relative positional relationship in only a direction orthogonal to a longitudinal direction of the electrode.

Displacement between the position of the region where the dielectric film is to be partially removed and the position of the electrode often becomes a problem in the direction orthogonal to the longitudinal direction of the electrode. Therefore, by measuring the positional relationship in the direction orthogonal to the longitudinal direction of the electrode, it is possible to shorter time required for measuring the positional relationship while sufficiently reducing positional displacement.

Further, it is preferable to form the electrode using a screen printing method.

In this manner, it is possible to form an electrode at the lowest cost by using the screen printing method, so that it is possible to manufacture a solar cell inexpensively.

Further, it is preferable to partially remove the dielectric film using laser.

In this manner, by removing the dielectric film using laser, it is possible to manufacture a solar cell inexpensively. Further, laser has good processing accuracy and can relatively easily adjust a position of a region where the dielectric film is to be partially removed.

Further, with the method for manufacturing a solar cell of the present invention, it is possible to form a diffusion layer by diffusing impurities in a region where the dielectric film is partially removed after partially removing the dielectric film and before forming the electrode.

In this manner, by forming a diffusion layer in the region where the dielectric film is partially removed, it is possible to sufficiently reduce positional displacement between the formed diffusion layer and the electrode on the diffusion layer.

Further, with the method for manufacturing a solar cell of the present invention, it is possible to prepare a semiconductor substrate having a diffusion layer on the first main surface as the semiconductor substrate.

By using such a semiconductor substrate having a diffusion layer on the first main surface, it is possible to easily form contact between the electrode and the diffusion layer while reducing positional displacement of the electrode.

Further, with the method for manufacturing a solar cell of the present invention, it is preferable to partially remove the dielectric film so that an amount of the dielectric film per unit area in a region where the dielectric film is removed becomes equal to or less than $1/10$ of an amount of the dielectric film per unit area in a region where the dielectric film is not removed.

By making the amount of the dielectric film per unit area equal to or less than $1/10$ in this manner, it is possible to sufficiently obtain an effect of removal of the dielectric film. That is, it is possible to sufficiently perform diffusion in the case of diffusion using the remaining dielectric as a mask. Further, in the case where an electrode is formed by causing the electrode to penetrate the dielectric film, because fire through becomes unnecessary when contact between the electrode and the semiconductor substrate located under the electrode is formed, low-temperature firing of the electrode becomes possible, so that it is possible to increase a degree of freedom of manufacturing process of the solar cell.

Further, to achieve the objects, the present invention provides a solar cell which has a base layer and an emitter layer adjacent to the base layer on a first main surface of a semiconductor substrate and in which an electrode is disposed on the base layer, wherein the base layer has a linear region having a length and a width on the first main surface, the linear region has a straight-line region shorter than the length of the linear region, and the straight-line region includes a region disposed at a position displaced from extensions of other straight-line regions of the linear region.

In this manner, when the straight-line region includes a region disposed at a position displaced from extensions of other straight-line regions, it is possible to reduce positional displacement between the base layer and the electrode when seen in a plane of the first main surface, so that it is possible to realize a solar cell having good characteristics and characteristics with little variation.

At this time, it is preferable that a width of the base layer is 50 μm or more and 250 μm or less, and a width of the electrode is 30 μm or more and 200 μm or less.

With such widths of the base layer and the electrode, it is possible to effectively reduce positional displacement between the base layer and the electrode, so that it is possible to realize a solar cell with better characteristics.

At this time, it is preferable that the emitter layer has a wedge-shaped region which is convex from the emitter layer side at the boundary between the base layer and the emitter layer adjacent to the base layer, a length of a bottom portion of the wedge-shaped region is 1 μm or more and 20 μm or less, and an angle of an apex of the wedge-shaped region is 70° or more and 110° or less.

By the boundary between the base layer and the emitter layer having such a shape, in a case where an electrode is formed in the vicinity of the boundary, because an area of contact between the base layer and the electrode increases compared to a case where there is no wedge-shaped region, contact resistance is relatively reduced, and adhesion strength of the electrode relatively increases.

Further, to achieve the objects, the present invention provides a solar cell having a first region which has a diffusion layer on a first main surface of a semiconductor substrate and which has a dielectric film having a predetermined film thickness on the diffusion layer, and a second region which includes a dielectric film thinner than the predetermined film thickness or which does not include the dielectric film, and in which an electrode is disposed in at least part of the second region, wherein the second region having a linear region has a length and a width on the first main surface, the linear region has a straight-line region shorter than the length of the linear region, and the straight-line region including a region disposed at a position displaced from extensions of other straight-line regions of the linear region, and an amount of the dielectric film per unit area in a region where the electrode is not formed in the second region is equal to or less, than 1/10 of an amount of the dielectric film per unit area in the first region.

In this manner, with the solar cell in which the straight-line region includes a region disposed at a position displaced from extensions of other straight-line regions, it is possible to reduce positional displacement between the second region and the electrode when seen in a plane of the first main surface. Further, by the amount of the dielectric film per unit area in the region where an electrode is not formed in the second region being equal to or less than 1/10 of the amount of the dielectric film per unit area in the first region, in such a solar cell, it is not necessary to perform fire through when contact between the electrode and the semiconductor substrate located under the electrode is formed upon manufacturing. Therefore, because low-temperature firing of the electrode becomes possible upon manufacturing, such a solar cell has a broader degree of freedom in process upon manufacturing.

At this time, it is preferable that a width of the second region is 50 µm or more and 250 µm or less, and a width of the electrode is 30 µm or more and 200 µm or less.

By the second region and the electrode having such widths, it is possible to realize a solar cell in which positional displacement between the second region and the electrode is effectively reduced.

At this time, it is preferable that the first region has a wedge-shaped region which is convex from the first region side at the boundary between the second region and the first region adjacent to the second region, a length of a bottom portion of the wedge-shaped region is 1 µm or more and 20 µm or less, and an angle of an apex of the wedge-shaped region is 70° or more and 110° or less.

By the boundary between the first region and the second region having such a shape, in the case where an electrode is formed in the vicinity of the boundary, an anchor effect appears at the electrode, and adhesion strength of the electrode relatively increases compared to a case where there is no wedge-shaped region.

Further, the present invention provides a solar cell module in which the solar cell is incorporated.

In this manner, the inventive solar cell can be incorporated in the solar cell module.

Further, the present invention provides a photovoltaic power generation system having the solar cell module.

In this manner, the inventive solar cell module incorporating the solar cell can be used in the photovoltaic power generation system.

Further, to achieve the objects, the present invention provides a solar cell manufacturing system including;

a dielectric film removing apparatus configured to partially remove a dielectric film on at least a first main surface of a semiconductor substrate, an electrode forming apparatus configured to form an electrode along a region where the dielectric is partially removed, an appearance inspecting apparatus configured to inspect the first main surface of the semiconductor substrate after the electrode is formed with the electrode forming apparatus to acquire data of relative positional relationship between a position of the region where the dielectric film is partially removed and a position of the formed electrode, and a data analyzing apparatus configured to determine a correction value for adjusting a position of a region where the dielectric film is to be partially removed based on the acquired data and feedback the correction value to the dielectric film removing apparatus.

In this manner, by the solar cell manufacturing system including the dielectric film removing apparatus, the electrode forming apparatus, the appearance inspecting apparatus and the data analyzing apparatus, and by making these apparatuses coordinate with each other, it is possible to efficiently reduce positional displacement between the region where the dielectric film is partially removed and the electrode and improve a manufacturing yield ratio of the solar cell. By this means, it is possible to make the manufactured solar cell inexpensive.

At this time, it is preferable that the appearance inspecting apparatus has a function of dividing a plane of the semiconductor substrate into a plurality of regions, allocating a coordinate representing the region for each of the divided regions and acquiring the data of relative positional relationship for each of the coordinates allocated to the divided regions.

In this manner, by dividing the plane of the semiconductor substrate into a plurality or regions, allocating the coordinate representing the region for each of these regions and measuring the positional relationship at these coordinates and adjusting the position of the region where the dielectric film is to be partially removed at these coordinates, it is possible to thin out the number of points to be measured to some extent. By this means, it is possible to increase productivity and efficiently manufacture a solar cell. It should be noted that because it can be considered that systematic positional displacement when the electrode is formed in the region where the dielectric film is removed continuously changes in a plane, it is not always necessary to measure the positional relationship by observing all the electrodes.

At this time, it is preferable that the dielectric film removing apparatus is a laser processing apparatus, and the electrode forming apparatus is a screen printing apparatus.

In this manner, by using the laser processing apparatus and the screen printing apparatus, it is possible to reduce positional displacement at low cost, so that it is possible to manufacture an inexpensive solar cell.

Advantageous Effects of Invention

According to inventive method for manufacturing a solar cell, it is possible to improve a manufacturing yield ratio of the solar cell by reducing positional displacement between the region where the dielectric film is partially removed and the electrode formed along the region. Further, according to the inventive solar cell, it is possible to realize a solar cell with high photoelectric conversion efficiency and with good characteristics, in which positional displacement of the electrode is small. Still further, according to the inventive solar cell manufacturing system, it is possible to improve a manufacturing yield ratio of the solar cell by reducing positional displacement of the electrode.

BRIEF DESCRIPTION OF DRAWINGS

FIG. 7 is a cross-sectional schematic diagram of a solar cell according to the present invention;

DESCRIPTION OF EMBODIMENT

As described above, in recent years, positional displacement between a base layer and a base electrode of a solar cell becomes a problem. The present inventors studied hard a countermeasure for reducing such positional displacement and brought the present invention to completion.

While the present invention will be described in detail below with reference to the drawings, the present invention is not limited to this.

A inventive method for manufacturing a solar cell of will be described below using an example where an N-type substrate is used as a semiconductor substrate, using FIG. 3.

Figure 1:
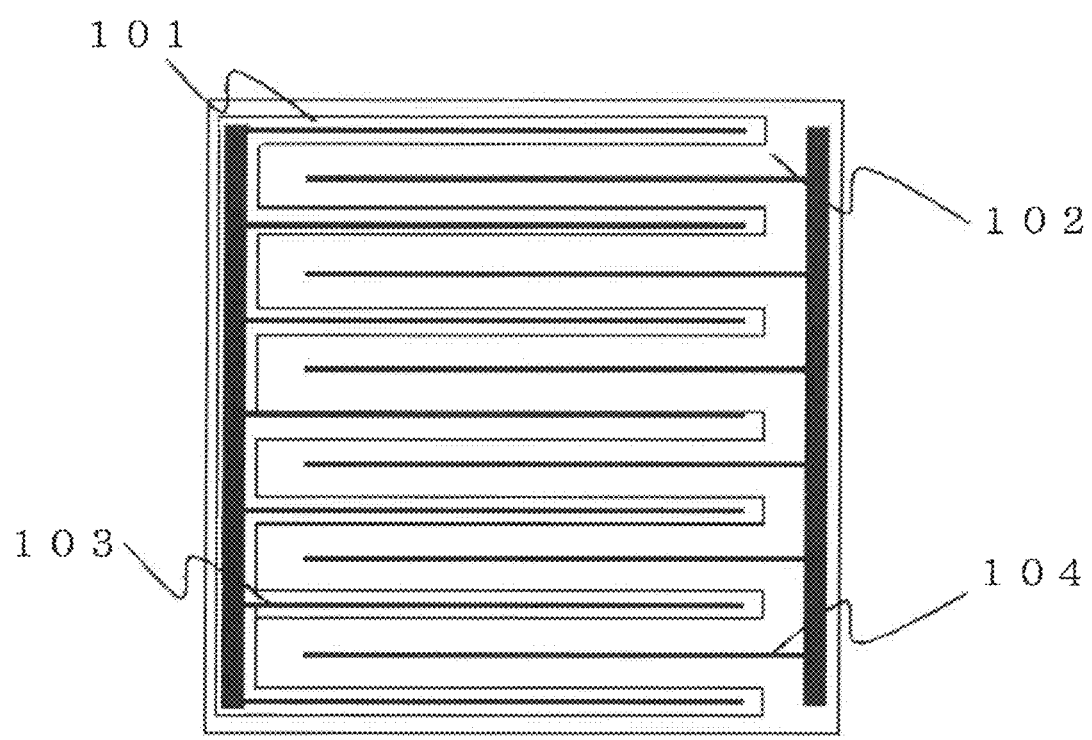
FIG. 1 is an overview of a typical back surface electrode type solar cell seen from a back surface side, to which the present invention can be applied.
Figure 2:
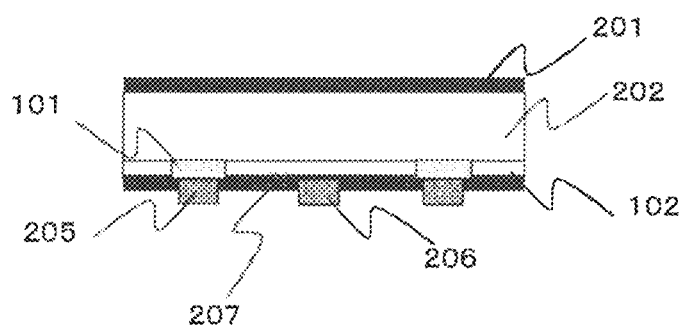
FIG. 2 is a cross-sectional schematic diagram a typical back surface electrode type solar cell, to which the present invention can be applied.
Figure 3:
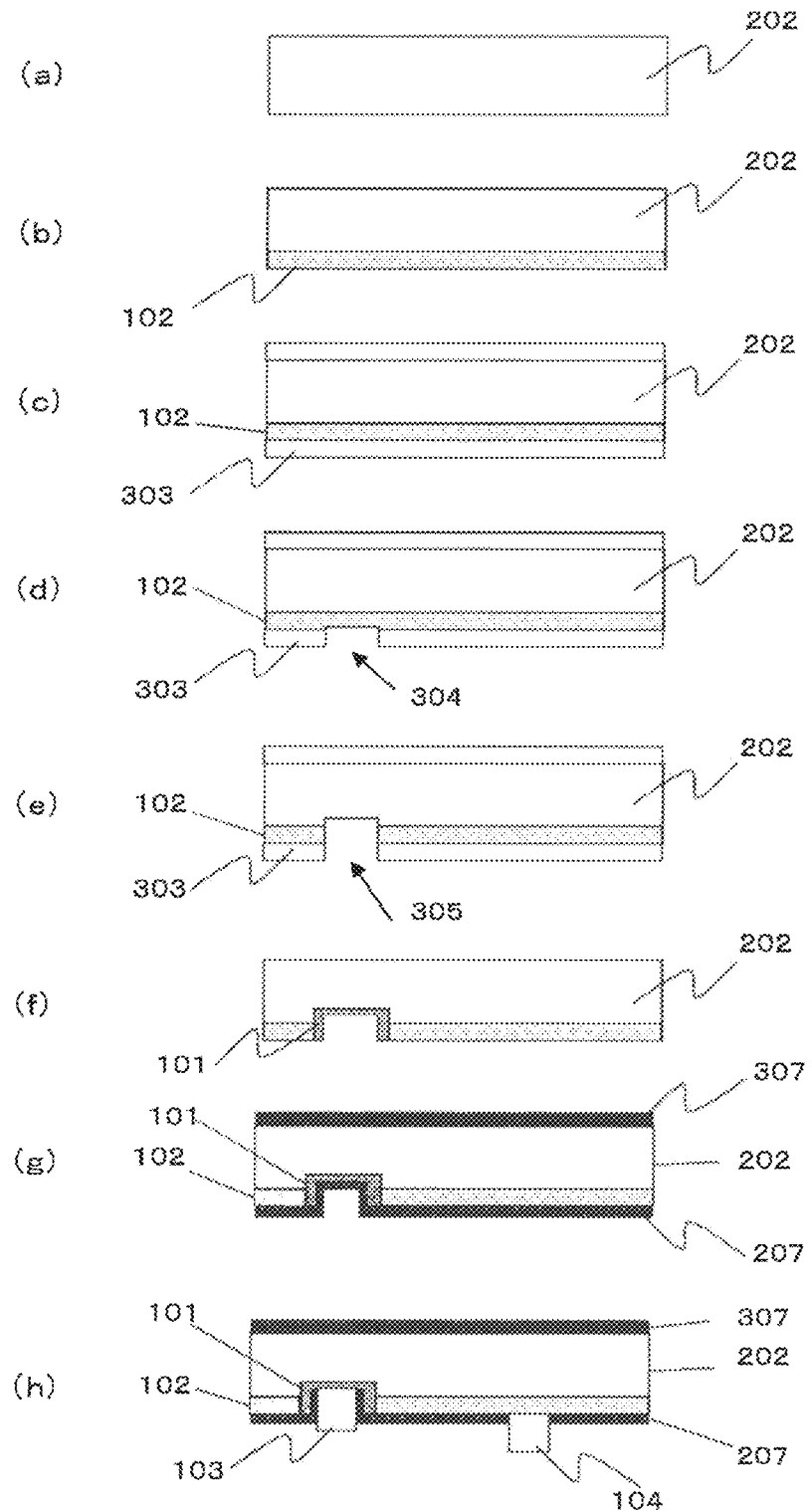
FIG. 3 is a process flow diagram illustrating an example of a manufacturing method of a back surface electrode type solar cell according to the present invention.

FIG. 3 is a process flow diagram illustrating an example of a manufacturing method of a back surface electrode type solar cell to which the present invention is applied.

First, a semiconductor substrate having a dielectric film on at least a first main surface is prepared. For example, a semiconductor substrate can be prepared as follows. An as-cut single-crystal {100} N-type silicon substrate 202 having specific resistance of 0.1 to 5 $\Omega \cdot cm$ is prepared by doping high-purity silicon with a quinquevalent element such as phosphorus, arsenic and antimony (step (a)), and slice damage on a surface is etched using high concentration alkali such as sodium hydroxide and potassium hydroxide whose concentration is from 5 to 60% or mixed acid of hydrofluoric acid and nitric acid, or the like. The single-crystal silicon substrate may be manufactured using any method of a CZ (Czochralski) method and an FZ (Floating zone) method. The substrate 202 does not always have to be a single-crystal silicon substrate and may be a polycrystalline silicon.

Subsequently, minute concavities and convexities called texture are formed on the surface of the substrate 202. Texture is an effective method for reducing reflectance of the solar cell. Texture is manufactured by immersing the substrate 202 in an alkali solution (whose concentration is from 1 to 10%, and a temperature is between 60 to 100° C.) such as heated sodium hydroxide, potassium hydroxide, potassium carbonate, sodium carbonate and sodium hydrogencarbonate for approximately 10 minutes to 30 minutes. It is also possible to promote reaction by dissolving a predetermined amount of 2-propanol with the solution.

After the texture is formed, the substrate is cleaned in an acid aqueous solution such as hydrochloric acid, sulfuric acid, nitric acid and hydrofluoric acid or mixture of these. It is also possible to improve cleanliness by mixing hydrogen peroxide.

An emitter layer 102 is formed on a first main surface of this substrate 202 (step (b)). The emitter layer 102 has a conductivity-type opposite to that of the substrate 202 (in this case, P-type) and has a thickness of approximately 0.05 to 1 µm. The emitter layer 102 can be formed through vapor-phase diffusion using $BBr_3$, or the like. Specifically, the substrate 202 is placed in a heat treat furnace such that two substrates 202 are superimposed as a set, mixed gas of $BBr_3$ and oxygen is introduced, and the substrate 202 is heat-treated at 950 to 1050° C. Nitrogen and argon are preferable as carrier gas. Further, it is also possible to form the emitter layer 102 using a method of applying an endemic liniment containing boron source on the whole surface of the first main surface and performing heat treatment at 950 to 1050° C. As the endermic liniment, for example, an aqueous solution containing 1 to 4% of boric acid as boron source, and 0.1 to 4% of polyvinyl alcohol as a thickener can be used.

After the emitter layer 102 is formed, a mask 303 is formed on the both main surfaces of the substrate 202 for forming a base layer in the next step (step (c)). As the mask 303, a silicon oxide film, a silicon nitride film, or the like, which is a dielectric film can be used. By using a CVD method, it is possible to form the both films by appropriately selecting a type of gas to be introduced. In the case of a silicon oxide film, it is also possible to form the film by thermally oxidizing the substrate 202. In this case, a silicon thermally oxidized film of approximately 100 nm can be formed by heat treating the substrate 202 at 950 to 1100° C. in the presence of oxygen for 30 minutes to 4 hours. While the film thickness can be arbitrarily changed by appropriately selecting a temperature, a period, gas, or the like, it is preferable that the film thickness is from 30 to 300 nm to achieve a mask function and to facilitate partial opening in the next step. This heat treatment may be performed within the same batch following heat treatment for forming the emitter layer 102 described above. In this manner, the semiconductor substrate having the dielectric film on at least the first main surface is prepared.

Subsequently, the dielectric film of the semiconductor substrate prepared in this manner is partially removed. For example, an opening portion 304 is formed by partially removing (opening) a mask at a part which is to be a region of the base layer 101 (step (d)). Specifically, the opening can be formed in a parallel line shape such that a width of the opening of the opening portion 304 is 50 µm or more and 250 µm or less and an interval between the opening portions 304 is 0.6 mm or more and 2.0 mm or less. While the mask 303 can be opened using a photolithography method or etching paste, opening using laser is easy and preferable. While a second harmonic wave such as a YAG system, a $YVO_4$ system and a $GdVO_4$ system can be used as a laser source, any laser source can be used if a wavelength is approximately from 500 to 700 nm. It can be considered that, in the future, laser having a further shorter wavelength can be utilized. While laser conditions can be determined appropriately, for example, it is possible to use laser whose output is 4 to 20 W, frequency is 10000 to 100000 Hz, and fluence is 1 to 5 $J/cm^2$, which includes galvo head, and whose scan speed is 100 to 5000 mm/second. By making the laser coordinate with CAD (Computer-aided design) data using a personal computer, or the like, it is possible to easily designate a processing position.

After the opening portion 304 is formed at the mask 303, the substrate 202 is immersed in an alkali aqueous solution such as KOH and NaOH which is heated at 50 to 90° C., and an unnecessary emitter layer 102 at the opening portion 304 is removed (etched) (step (e)). By this means, the opening portion 305 where the emitter layer is removed is formed.

Subsequently, a base layer 101 is formed (step (f)). A vapor-phase diffusion method using phosphoryl chloride can be used to form the base layer 101. By heat treating the substrate 202 at 830 to 950° C. in the atmosphere of phosphoryl chloride and nitrogen oxygen mixed gas, a phosphorus diffusion layer ($N^+$ layer) which becomes the base layer 101 is formed. The base layer 101 can be also formed using a method of performing heat treatment after spin coating or printing a material containing phosphorus, other than the vapor-phase diffusion method. After the base layer 101 is formed, the mask 303 and glass formed on the surface are removed using hydrofluoric acid, or the like.

Figure 4:
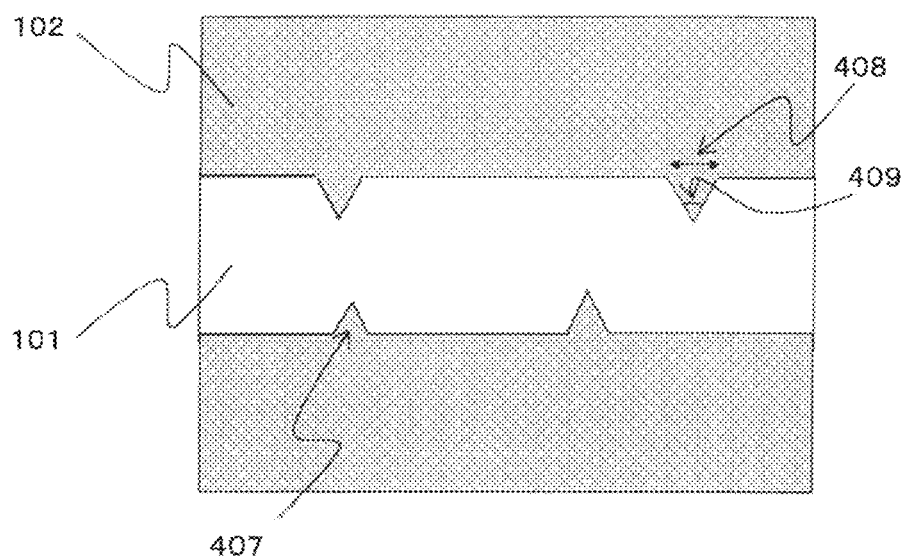
FIG. 4 is a top schematic diagram illustrating a shape of a base it formed by laser processing according to the present invention.

If a region which is to be a base layer is formed at the mask by performing laser processing as described above, because a laser spot is not a rectangle, a peculiar pattern (shape) is formed at the boundary between the base layer 101 and the emitter layer 102. A top schematic diagram of the base layer 101 formed by laser processing is illustrated in FIG. 4. As illustrated in FIG. 4, at the boundary between the base layer 101 and the emitter layer 102 adjacent to the base layer 101, a wedge-shaped region 407 which is convex from the emitter layer 102 side is formed. This wedge-shaped region 407 particularly becomes obvious after etching. An apex angle 409 of the wedge-shaped region 407 is 70° or more and 110° or less, and a length 408 of a bottom portion of the wedge-shaped region 407 is approximately 1 μm or more and 20 μm or less.

Subsequently, an antireflection coat 307 is formed on a second main surface which is a main surface opposite to the first main surface (step (g)). As the antireflection coat 307, a silicon nitride film, a silicon oxide film, or the like, can be utilized. In the case of a silicon nitride film, the film having a film thickness of approximately 100 nm is formed using a plasma CVD apparatus. While mixture of silane ($SiH_4$) and ammonia ($NH_3$) is often used as reaction gas, nitrogen can be also used instead of $NH_3$. Further, in order to adjust a process pressure, to dilute reaction gas and, further, to promote a bulk passivation effect, of the substrate in the case where polycrystalline silicon is used for the substrate, hydrogen may be mixed with the reaction gas. Meanwhile, in the case of a silicon oxide film, while the film can be formed using the CVD method, high characteristics can be obtained from a film obtained by a thermal oxidation method. Further, in order to increase a protective effect of the surface, the antireflective coat 307 may be formed after an aluminum oxide film is formed on the surface of the substrate in advance.

Also on the first main surface, a silicon nitride film or a silicon oxide film can be utilized as a back surface top coat 207. A film thickness of the back surface top coat 207 is preferably between 50 and 250 nm. As in the case of the second main surface (light receiving surface) side, the back surface top coat 207 can be formed using the CVD method in the case of a silicon nitride film, and using the thermal oxidation method or the CVD method in the case of silicon oxide film. Further, in order to increase a protective effect of the surface, the silicon nitride film, the silicon oxide film, or the like may be formed after an aluminum oxide film is formed on the surface of the substrate in advance.

Subsequently, an electrode is formed along a region where the dielectric film (mask 303) is partially removed. The electrode can be formed as follows. The base electrode 103 is formed using, for example, a screen printing method (step (h)). For example, a plate having a width of opening of 30 μm or more and 200 μm or less and having a parallel line pattern of an interval of between 0.6 and 2.0 mm is prepared, and Ag paste in which Ag powder and glass frit are mixed with an organic binder is printed along the base layer 101. While all the dielectric film (mask 303) itself is removed, a region where the base layer 101 exists is a portion where the dielectric film of the semiconductor substrate is partially removed in the step (d). In a similar manner, Ag paste is printed as an emitter electrode 104. The Ag paste for the base electrode 103 may be the same as or different from the Ag paste for the emitter electrode 104. After printing of the electrodes as described above, the Ag powder is made to penetrate through the silicon nitride film, or the like, by heat treatment (fire through), so that the electrodes are connected to the silicon located under the electrodes. It should be noted that it is also possible to fire the base electrode 103 and the emitter electrode 104 separately. Firing is normally performed through treatment at a temperature 700° C. or more and 850° C. or less for 5 to 30 minutes.

Since there are 80 to 260 base layers 101 and base electrodes 103, position adjustment is not easy. Because electrodes are formed through complex factors of displacement such as positional displacement upon laser processing, positional displacement upon printing of electrodes and stretch of a plate. While there can be a method in which the position of laser and the positions of the electrodes are respectively measured in advance using length measuring machine, or the like, because there is more than one factor of displacement, this method is not effective.

The inventive method for manufacturing a solar cell includes measuring relative positional relationship between a position of the region where the dielectric film is partially removed and the positon of the formed electrode for the semiconductor substrate after partially removing the dielectric film and forming the electrode. In the case of this example, specifically, the relative positional relationship between the base layer 101 and the base electrode 103 is measured by actually observing the substrate in which the base layer 101 and the base electrode 103 are formed using, for example, a microscope, or the like. Then, for a newly prepared semiconductor substrate 202 having a mask (dielectric film) 303 on at least a first main surface, after a position of a region where the mask 303 is to be partially removed is adjusted based on the measured positional relationship, the mask 303 is partially removed. That is, in the present invention, the measured relative positional relationship is fed back to a laser processing position, and then, a dielectric film of another substrate is partially removed using laser. All points of the base electrodes may be observed and measured, or a plane of the substrate may be divided into regions of 3×3, 6×7, or the like, and each single point may be observed for each region.

While it is preferable that there are a plurality of substrates 202 to be observed for measuring relative positional relationship, there may be one substrate 202, All the printed substrates 202 may be observed, or one of several to several hundred substrates 202 may be picked out and observed, and this may be appropriately determined according to a scale of manufacturing and time required for observation. Further, the substrate 202 does not always have to be a product, and may be a dummy substrate in which at least a dielectric film is partially removed and which is subjected to forming a region of a base layer and forming an electrode.

Figure 5:
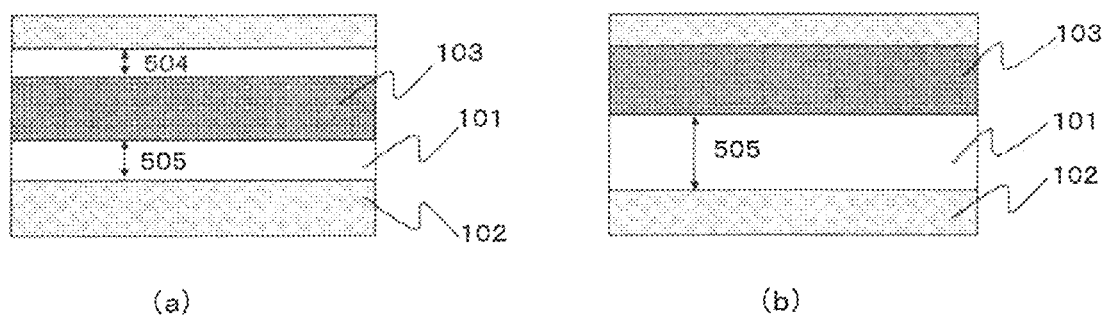
FIG. 5 is a top schematic diagram illustrating relative positions of the base layer and a base electrode, according to the present invention.

As a specific method for measuring relative positional relationship, there is a method in which a distance between a base electrode end and a base region (base layer) end is measured. Because displacement mainly becomes a problem in a direction orthogonal to a longitudinal direction of the electrode, measurement may be performed in only this direction. FIG. 5 illustrates a top schematic diagram illustrating relative positions of the base layer 101 and the base electrode 103. The distance between the base electrode end and the base layer end can be defined using two distances of a distance 504 at an upper side and a distance 505 at a lower side. As illustrated in FIG. 5(a), if the base electrode 103 is completely fit within the base layer 101, a finite value (not zero) can be obtained as the both distances 50 and 505. On the other hand, as illustrated in FIG. 5(b), if displacement occurs, a distance 504 at an upper side is measured as zero. In other words, if one of the distances 504 and 505 is zero, it is judged that displacement occurs. As a method for determining an amount of displacement, there are a method using a greater value between the values of the distances 504 and 505, and a method in which an electrode width and a base region width are measured at the same time and a protrusion amount is estimated through addition and subtraction.

If the displacement amount is determined, a correction amount of the position where the base layer is to be formed is determined. In order to dispose the base electrode 103 at the center of the base layer 101, correction had better be performed such that the values of the distances 504 and 505 become the same for each selected coordinate in a plane of the substrate. Convergence becomes earlier by determining the correction amount after redefining the distances 504 and 505 while setting the protrusion amount as a negative value.

Further, it is also possible to use a method in which a frequency of displacement is obtained instead of obtaining a specific amount of displacement. That is, a frequency (probability) of displacement is calculated by observing (measuring) whether or not the base electrode 103 is fit within the base layer 101 for a plurality of substrates. More specifically, coordinate data in which one of the distances 504 and 505 is zero is accumulated, and the number of substrates in which displacement occurs÷the number of observed substrates×100(%) is calculated as a frequency of occurrence of displacement in each case of a case of displacement to an upper side (distance 504 is zero) and a case of displacement to a lower side (distance 505 is zero) for each coordinate within the substrate. The frequency of occurrence of displacement becomes greater for a coordinate (position) at which an amount of displacement is larger. The correction amount for the position where the base layer is to be formed in this case is preferably 1 to 50 μm for each correction, because, if the position is adjusted largely at a time, the whole balance is lost.

If operation for adjusting the position where the base layer is to be formed for each region within the substrate as described above is repeated, as illustrated in FIG. 6, a position 607 where a center line 606 of the base layer 101 becomes discontinuous occurs, and the base layer 101 cannot be formed on a straight line. By the base layer 101 having such a structure, it is possible to reduce positional displacement between the base layer 101 and the base electrode 103

Figure 6:
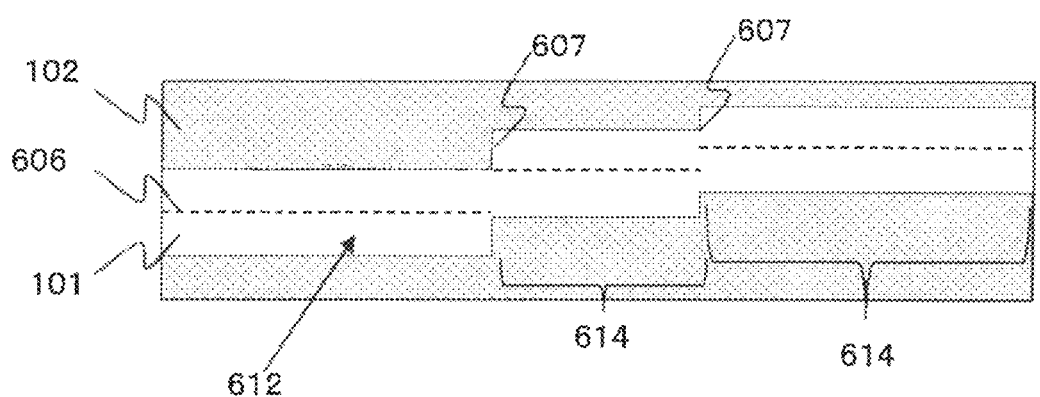
FIG. 6 is a top schematic diagram illustrating an example of a shape of the base layer according to the present invention.

A first embodiment of the inventive solar cell will be described next with reference to FIG. 6, or the like. The solar cell of the first embodiment of the present invention is a solar cell which has a base layer 101 and an emitter layer 102 adjacent to the base layer 101 on a first main surface of a semiconductor substrate, and in which a base electrode 103 is disposed on the base layer 101, the base layer 101 has a linear region 612 having a length and a width on the first main surface, the linear region 612 has a straight-line region 614 which is shorter than the length of the linear region 612, the straight-line region 614 includes a region disposed at a position displaced from extensions of other straight-line regions 614 of the linear region 612.

In this manner, according to the solar cell in which the straight-line region 614 includes a region disposed at a position displaced from extensions of other straight-line regions 614, it is possible to reduce positional displacement between the base layer 101 and the base electrode 103 when seen in a plane of the first main surface, so that it is possible to obtain a solar cell with good characteristics and with small variation in characteristics.

Further, it is preferable that a width of the base layer 101 is 50 μm or more and 250 μm or less, and a width of the base electrode 103 is 30 μm or more and 200 μm or less. By the base layer 101 and the base electrode 103 having such widths, positional displacement between the base layer 101 and the base electrode 103 is effectively reduced, so that it is possible to obtain a solar cell with better characteristics.

Further, as illustrated in FIG. 4, it is preferable that the emitter layer 102 has a wedge-shaped region 407 which is convex from the emitter layer 102 side at the boundary between the base layer 101 and the emitter layer 102 adjacent to the base layer 101, and a length 408 of a bottom portion of the wedge-shamed region 407 is 1 μm or more and 20 μm or less, and an angle 409 of an apex of the wedge-shaped region 407 is 70° or more and 110° or less. By the boundary between the base layer 101 and the emitter layer 102 having such a shape, in a case where an electrode is formed in the vicinity of the boundary, since an area of contact between the base layer 101 and the base electrode 103 increases compared to a case where there is no wedge-shaped region 407, contact resistance is relatively reduced and adhesion strength of the electrode relatively increases.

An application example of the present invention to the back surface electrode type solar cell has been described above. However, the present invention is not limited to this, and can be also applied to a method for manufacturing a solar cell in which a protective coat (dielectric film) on the surface of the substrate is removed using laser, and an electrode is directly formed at a position where the protective coat is removed, that is, a method in which laser is locally radiated so as to form a pattern on the substrate whose surface is protected with a dielectric film such as a silicon nitride film and a silicon oxide film, to provide an opening for bringing the electrode contact with the silicon nitride film or the silicon oxide-film. An amount of the protective coat (=a thickness×area of the protective coat) can be removed to an amount equal to or less than $\frac{1}{10}$ by laser processing. By this means, it is not necessary to perform fire through, and low-temperature firing of the electrode becomes possible, so that it is possible to increase a degree of freedom of manufacturing process of the solar cell.

A second embodiment of the inventive solar cell corresponding to the method for manufacturing a solar cell of the present invention will be described with reference to FIG. 7(a) and FIG. 7(b). As illustrated in FIG. 7(a), the solar cell of the second embodiment of the present invention is a solar cell which has a first region 724 having a diffusion layer 720 on a first main surface of a semiconductor substrate 702 and having a dielectric film (passivation film) 722 having a predetermined film thickness on the diffusion layer 720, and a second region 726 which includes a dielectric film thinner than the predetermined film thickness or which does not include a dielectric film, in which an electrode 728 is disposed in at least part of the second region 726. As illustrated in FIG. 7(b), the second region 726 has a linear region 712 having a length and a width on the first main surface, the linear region 712 has a straight-line region 714 shorter than the length of the linear region 712, and the straight-line region 714 includes a region disposed at a position displaced from extensions of other straight-line regions 714 of the linear region 712, and an amount of the dielectric film per unit area of a region where the electrode 728 is not formed in the second region 726 is equal to or less than 1/10 of an amount of the dielectric film per unit area in the first region 724.

In this manner, with the solar cell in which the straight-line region 714 includes a region disposed at a position displaced from extensions of other straight line regions 714, as described above, it is possible to reduce positional displacement between the second region 726 and the electrode 728 when seen in a plane of the first main surface. Further, by the amount of the dielectric film per unit area of a region where the electrode 728 is not formed in the second region 726 being equal to or less than 1/10 of an amount of the dielectric film per unit area in the first region, as described above, since it is not necessary to perform fire through when contact between the electrode 728 and the substrate located under the electrode 728 is formed, low-temperature firing of the electrode 728 becomes possible, so that it is possible to increase a degree of freedom of the manufacturing process of the solar cell.

Further, it is preferable that a width of the second region 726 is 50 µm or more and 250 µm or less, and a width of the electrode 728 is 30 µm or more and 200 µm or less. By the second region 726 and the electrode 728 having such widths, it is possible to obtain a solar cell in which positional displacement between the second region 726 and the electrode 728 is more effectively reduced.

Further, it is preferable that the first region 724 has a wedge-shaped region which is convex from the first region 724 side at the boundary between the second region 726 and the first region 724 adjacent to the second region 726, a length of a bottom portion of the wedge-shaped region is 1 µm or more and 20 µm or less, and an angle of an apex of the wedge-shaped region is 70° or more and 110° or less. By the boundary between the first region 724 and the second region 726 having such a shape, in the case where an electrode is formed in the vicinity of the boundary, an anchor effect appears at the electrode, and adhesion strength of the electrode relatively increases compared to a case where there is no wedge-shaped region.

Figure 8:
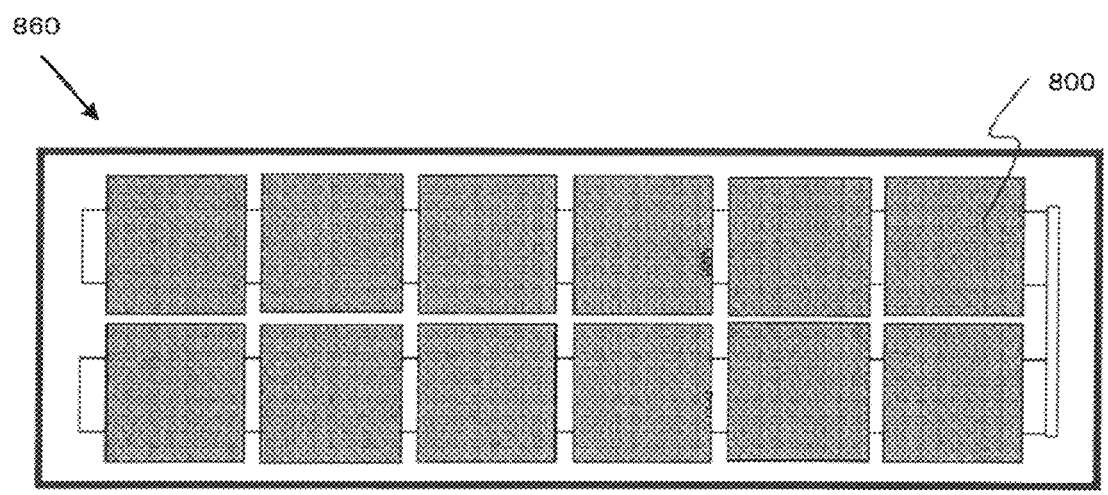
FIG. 8 is an overview of a solar cell module according to the present invention.

The inventive solar cell described above can be incorporated in a solar cell module. An overview of an example of the solar cell module in which the inventive solar cell is incorporated is illustrated in FIG. 8. While FIG. 8 illustrates an example of the solar cell module in which the back surface electrode type solar cell is incorporated, the solar cell module is not limited to this, and the present invention can be also applied to a solar cell module in which other types of solar cells of the present invention are incorporated. The solar cells 800 of the present invention described above are paved in a tile shape within a solar cell module 860.

Figure 9:
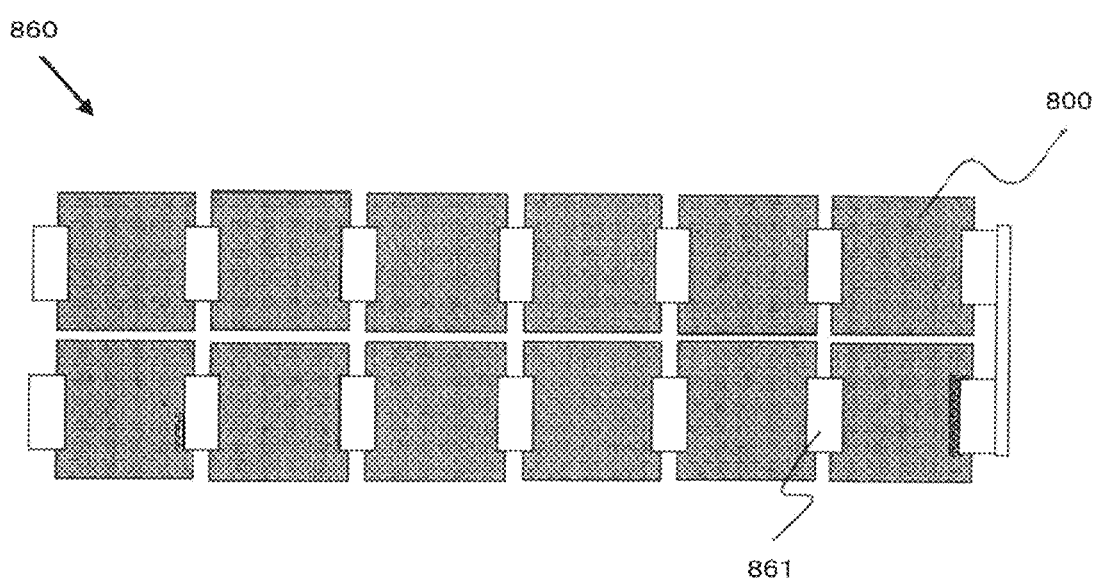
FIG. 9 is a schematic diagram of inside of a back surface side of the solar cell module according to the present invention.

Several to several tens of adjacent solar cells 800 are electrically connected in series within the solar cell module 860 to configure a series circuit called a string. An overview of the string is illustrated in FIG. 9. FIG. 9 corresponds to a schematic diagram of inside of a back surface side of the module which is normally not exposed. Further, a finger electrode and a bus bar are not illustrated. As illustrated in FIG. 9, in order to connect the solar cells in series, a P bus bar (a bus bar electrode connected to a finger electrode jointed to a P-type layer of the substrate) and an N bus bar (a bus bar electrode connected to a finger electrode jointed to an N-type layer of the substrate) of the adjacent solar cells 800 are connected through a tab lead line 861, or the like.

Figure 10:
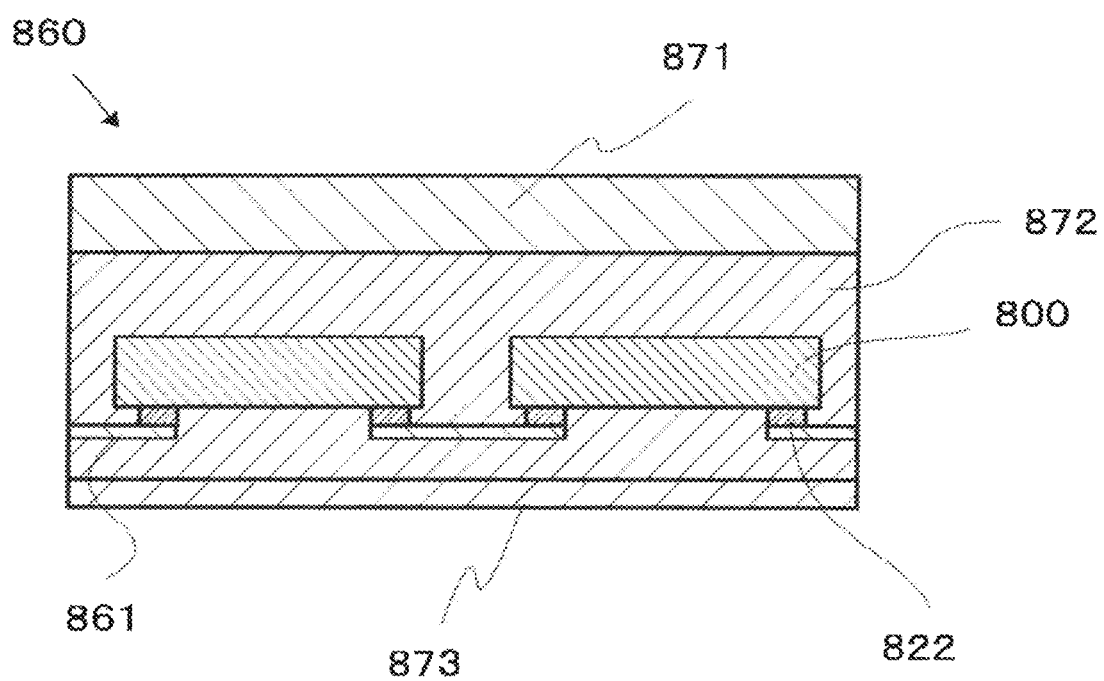
FIG. 10 is a cross-sectional schematic diagram of the solar ceil module according to the present invention.

A cross-sectional schematic diagram of the solar cell module 860 is illustrated in FIG. 10. As described above, the string is configured by connecting the lead lines 861 to the bus bar electrodes 822 in a plurality of solar cells 800. The string is normally sealed with a translucent filler 872 such as EVA (ethylene vinyl acetate), and a non-light receiving surface side is covered with a weather resistant resin film 873 such as PET (polyethylene terephthalate), and a light receiving surface is covered with a light receiving surface protection material 871 which has translucency and has strong mechanical strength such as soda-lime glass. As the filler 872, polyolefin, silicone, or the like, can be used other than the EVA.

Figure 11:
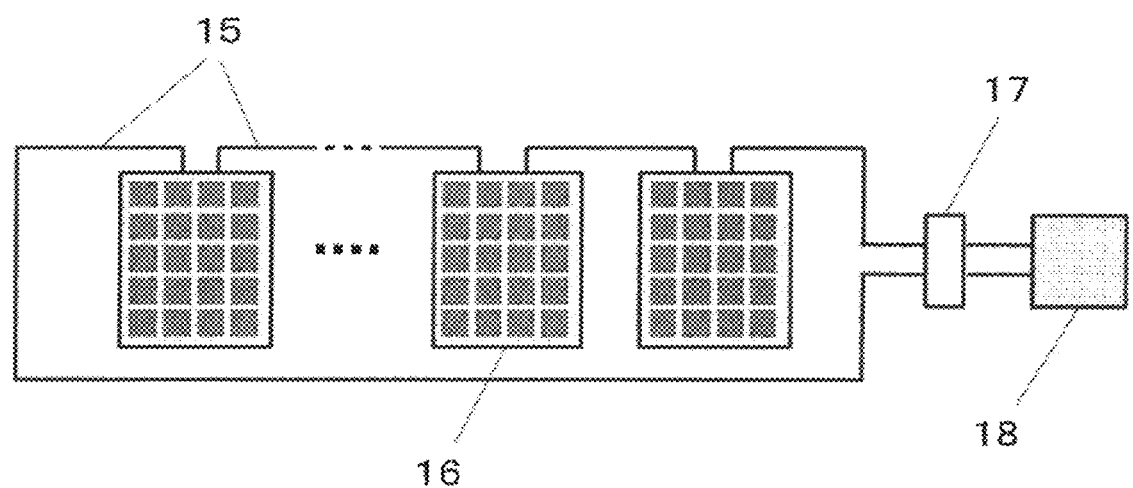
FIG. 11 is a schematic diagram of a photovoltaic power generation system according to the present invention.

Further, it is also possible to manufacture and configure a photovoltaic power generation system using this module. FIG. 11 illustrates basic configuration of a photovoltaic power generation system in which the inventive modules are connected. A plurality of solar cell modules 16 are connected in series using wiring 15 and supply generated power to an external load circuit 18 by way of an inverter 17. While not illustrated in FIG. 11, the system may further include a secondary cell which accumulates generated power.

While an example of an N-type substrate has been described above, in the case of a P-type substrate, it is only necessary to diffuse phosphorus, arsenic, antimony, or the like, for forming an emitter layer and diffuse boron, Al, or the like for forming a base layer, and it is obvious that a P-type substrate can be applied to the inventive method for manufacturing a solar cell and the inventive solar cell.

Figure 12:
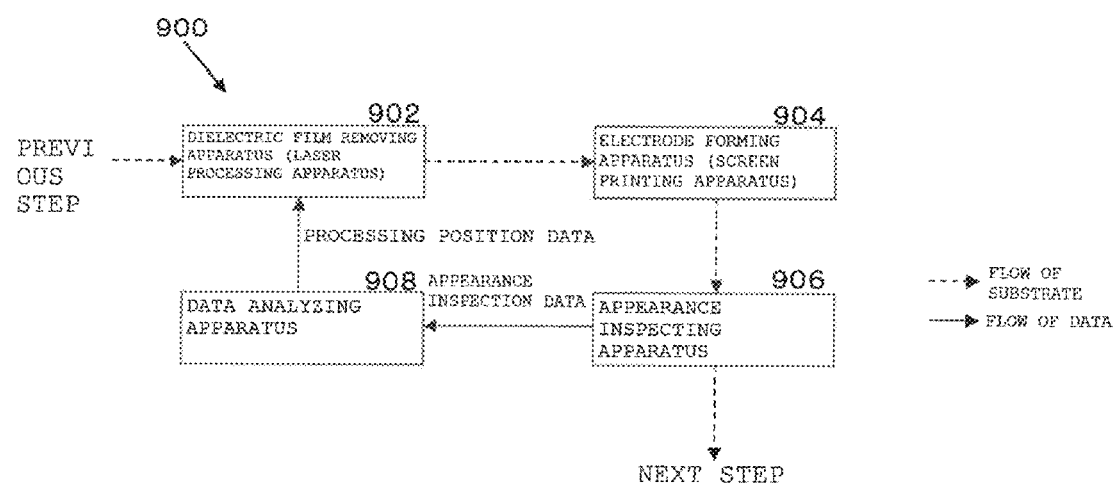
FIG. 12 is schematic diagram illustrating an example of configuration of a solar cell manufacturing system according to the present invention.

The inventive solar cell manufacturing system will be described next with reference to FIG. 12. FIG. 12 is a schematic diagram illustrating an example of configuration of the solar cell manufacturing system according to the present invention. The solar cell manufacturing system 900 includes a dielectric film removing apparatus 902 which partially removes a dielectric film on at least a first main surface of a semiconductor substrate, an electrode forming apparatus 904 which forms an electrode along a region where the dielectric film is partially removed, an appearance inspecting apparatus 906 which inspects the first main surface of the semiconductor substrate after the electrode is formed at the electrode forming apparatus 904 to acquire data of relative positional relationship between a position of the region where the dielectric film is partially removed and a position of the formed electrode, and a data analyzing apparatus 908 which determines a correction value for adjusting a position of a region where a dielectric film is to be partially removed based on the acquired data and feeds back the correction value to the dielectric film removing apparatus 902. In this manner, by the solar cell manufacturing system including the dielectric film removing apparatus 902, the electrode forming apparatus 904, the appearance inspecting apparatus 906 and the data analyzing apparatus 908 and making these apparatus coordinate with each other, it is possible to efficiently reduce positional displacement between the position where the dielectric film is partially removed and the position of the electrode, so that it is possible to improve a manufacturing yield ratio of the solar cell. By this means, it is possible to make the manufactured solar cell inexpensive.

The dielectric film removing apparatus 902 may be a laser processing apparatus, and the electrode forming apparatus 904 may be a screen printing apparatus. For example, after screen printing is performed using the screen printing apparatus (electrode forming apparatus 904), appearance inspection is performed using the appearance inspecting apparatus 906, and the data analyzing apparatus 908 adjusts a position for laser processing using the obtained data and feeds back to laser processing recipe of the laser processing apparatus (dielectric film removing apparatus 902). In this manner, by using the laser processing apparatus and the screen printing apparatus, it is possible to reduce positional displacement at low cost, so that it is possible to manufacture an inexpensive solar cell. Further, the data analyzing apparatus 908 may be independently provided or integrated with the appearance inspecting apparatus 906 or the laser processing apparatus 902. If image data is converted into an electrical signal using a CCD camera, or the like, and the appearance inspecting apparatus 906, the data analyzing apparatus 908 and the laser processing apparatus 902 are connected using a network, it is also possible to automatically perform all series of operation.

EXAMPLES

While the present invention will be more specifically described below using examples and a comparison example, the present invention is not limited thereto.

Example 1

A solar cell was manufactured using the inventive method for manufacturing a solar cell. First, 20 phosphorus-doped {100} N-type as-cut silicon substrates each having a thickness of 200 μm and specific resistance of 1 Ω·cm were prepared. Then, damage layers of the silicon substrates were removed using a hot concentrated potassium hydroxide aqueous solution. Subsequently, the substrates were immersed in an aqueous solution of potassium hydroxide/2-propanol at 72° C. to form texture, and subsequently cleaned in a mixed solution of hydrochloric acid/hydrogen peroxide heated at 75° C.

Then, P-type diffusion layers (emitter layers) were formed on the substrates. The substrates were placed in a heat treat furnace such that two substrates were superimposed as a set, mixed gas of $BBr_3$, oxygen and argon was introduced, and the substrates were heat-treated at 1000° C. for ten minutes. As a result of measuring the P-type diffusion layers formed on the substrates using a four probe method, sheet resistance of 50 Ω was obtained.

These substrates were thermally oxidized in the presence of oxygen for three hours at 1000° C. to form masks (dielectric films) on surfaces of the substrates. The masks on back surfaces of the substrates were opened using laser. As a laser source, a second harmonic wave of Nd:$YVO_4$ was used. An opening pattern was made to have a shape of parallel lines having an interval of 1.2 mm. Output was set at 18 W, and scan speed was set at 600 mm/second. The substrates where the opening portions were formed were immersed in KOH at 80° C. to remove the emitter layers of the opening portions.

Then, the substrates were heat-treated for 40 minutes in a state where light receiving surfaces of the substrates were superimposed at 870° C. in the presence of phosphorous oxychloride to form phosphorous diffusion layers (base layers) at the opening portions. Then, the masks and surface glass were removed by immersing these substrates in hydrofluoric acid whose concentration was 12%.

After the treatment, silicon nitride films were formed on both surfaces of the substrates using a plasma CVD apparatus. The film thickness of the silicon nitride films on the both surfaces was made 100 nm. When widths of the base layers were measured using a microscope at this time, the widths were roughly 190 μm in a plurality of substrates.

Then, Ag paste was respectively printed on the base layers and the emitter layers to form base electrodes, and the base electrodes were dried. These are fired in the atmosphere of air at 780° C. The substrates (substrates of a first cycle) for measuring relative positional relationship between the base layers and the base electrodes were manufactured as described above.

Figure 13:
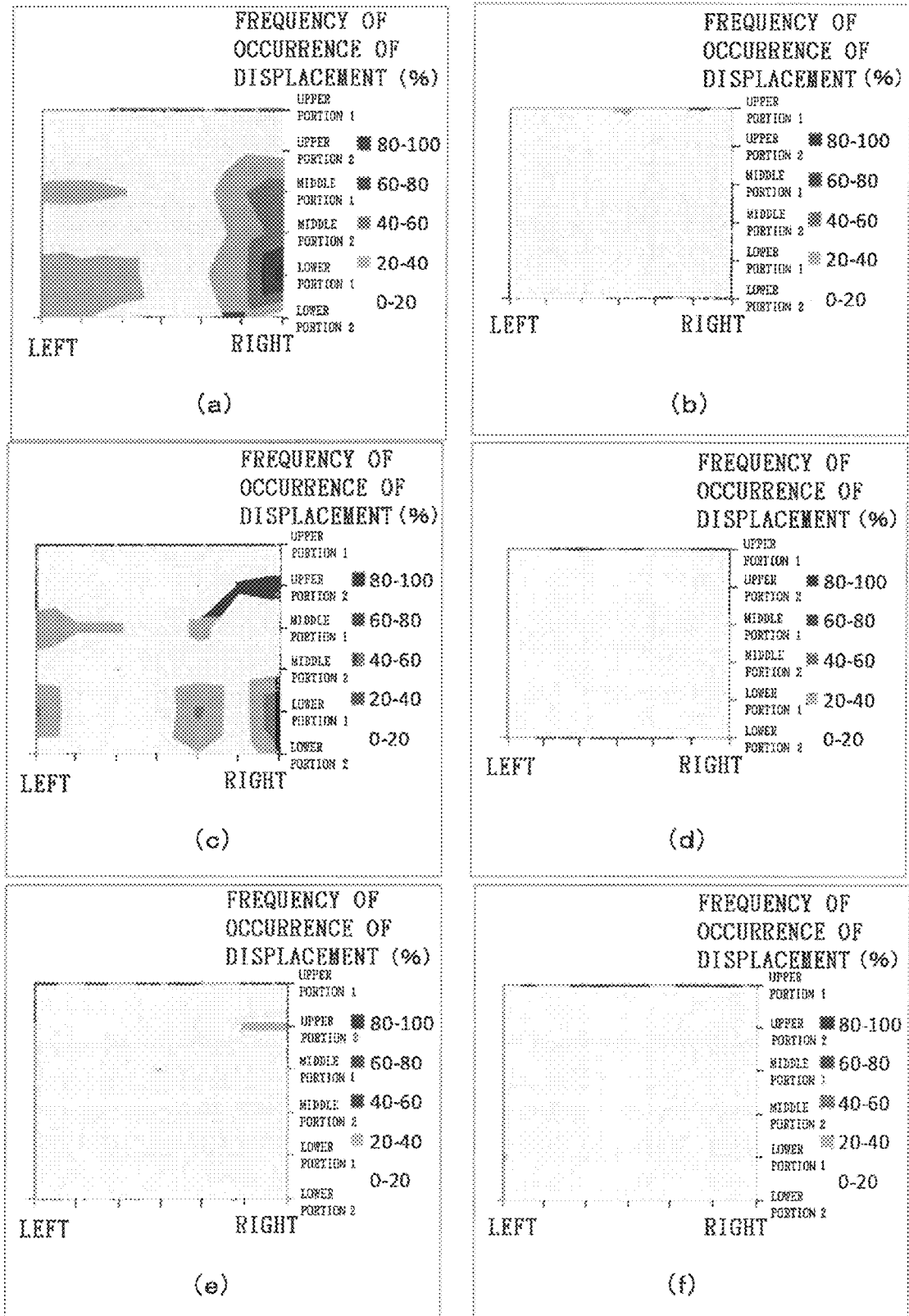
FIG. 13 is a diagram illustrating in-plane distribution of frequencies of positional displacement between the base layer and the base electrode according to the present invention.

Regarding completed 20 substrates of the first cycle, the vicinity of the base electrodes was observed using a microscope to determine positional displacement between the base layers and the base electrodes. A plane of each substrate was divided into 42 regions of 6×7, and one point was observed for each region. A result of mapping of a frequency of occurrence of displacement in the substrates of the first cycle is illustrated in FIG. 13(a) and FIG. 13(b). A case where the base electrodes are displaced to an upper side with respect to the base layers is illustrated in FIG. 13(a), and a case where the base electrodes are displaced to a lower side with respect to the base layers is illustrated in FIG. 13(b). When FIG. 13(a) is compared with FIG. 13(b), it can be understood that, in the substrates of the first cycle, displacement of the base electrodes to the upper side with respect to the base layers occur with a high frequency, and, particularly, displacement often occurs at a lower right side of the substrates. It can be considered that since an amount of stretch of a printing plate is different in a plane, the base electrodes do not form complete parallel lines, so that the base electrodes cannot completely match the base layers.

Based on this measurement result, first adjustment of the position for laser processing was performed. Specifically, in a lower right portion of the substrate correction to move to an upper side in the drawing by 30 μm was performed, and in a lower left portion, correction to move to an upper side in the drawing by 2 μm was performed. Laser processing was performed at this position, and 20 cells were manufactured through the same steps as those described above after a KOH etching step (substrates of a second cycle). The vicinity of the electrodes in the completed 20 substrates was observed, and positional displacement was determined. In a similar manner to that described above, a case where the base electrodes are displaced to an upper side with respect to the base layers is illustrated in FIG. 13(c), and a case where the base electrodes are displaced to a lower side with respect to the base layers is illustrated in FIG. 13(d). While it can be understood that, compared to FIG. 13(a) and FIG. 13(b), a frequency of occurrence of displacement at a right side of the substrates is improved, a frequency of occurrence of displacement to an upper side is still slightly high.

Based on this measurement result, second adjustment of the positon for laser processing was performed. Specifically, at regions with a high frequency of displacement in a lower portion of the substrates, corrections to move to an upper side in the drawing by 20 μm were performed. Laser processing was performed at this position, and cells were manufactured through the same steps as those described above after the KOH etching step (substrates of a third cycle). The vicinity of electrodes in the completed 20 substrates was observed, and positional displacement was determined. A case where the base electrodes are displaced to an upper side with respect to the base layers is illustrated in FIG. 13(e), and a case where the base electrodes are displaced to a lower side with respect to the base layers is illustrated in FIG. 13(f). Positional displacement is scarcely seen in a plane.

Example 2

One of the substrates of the first cycle manufactured in Example 1 was picked out, and a distance between a base layer end and a base electrode end (that is, an amount of a gap between the base layer end and the electrode end, corresponding to distances 504 and 505 in FIG. 5) was measured. A plane of the substrate was divided into 42 regions of 6×7, and one point was measured for each region. At this time, an electrode width was also measured at the same time. At a position where the electrode protruded from the base layer, a value of the distance between the base layer end and the base electrode end was obtained by expanding the value to a negative value using the following equation.

(Distance between the base layer end and the base electrode end at a position where the electrode protrudes from the base layer)=(base layer width)−(distance between the electrode end and the base layer end)−(electrode width)   (equation 1)

Figure 14:
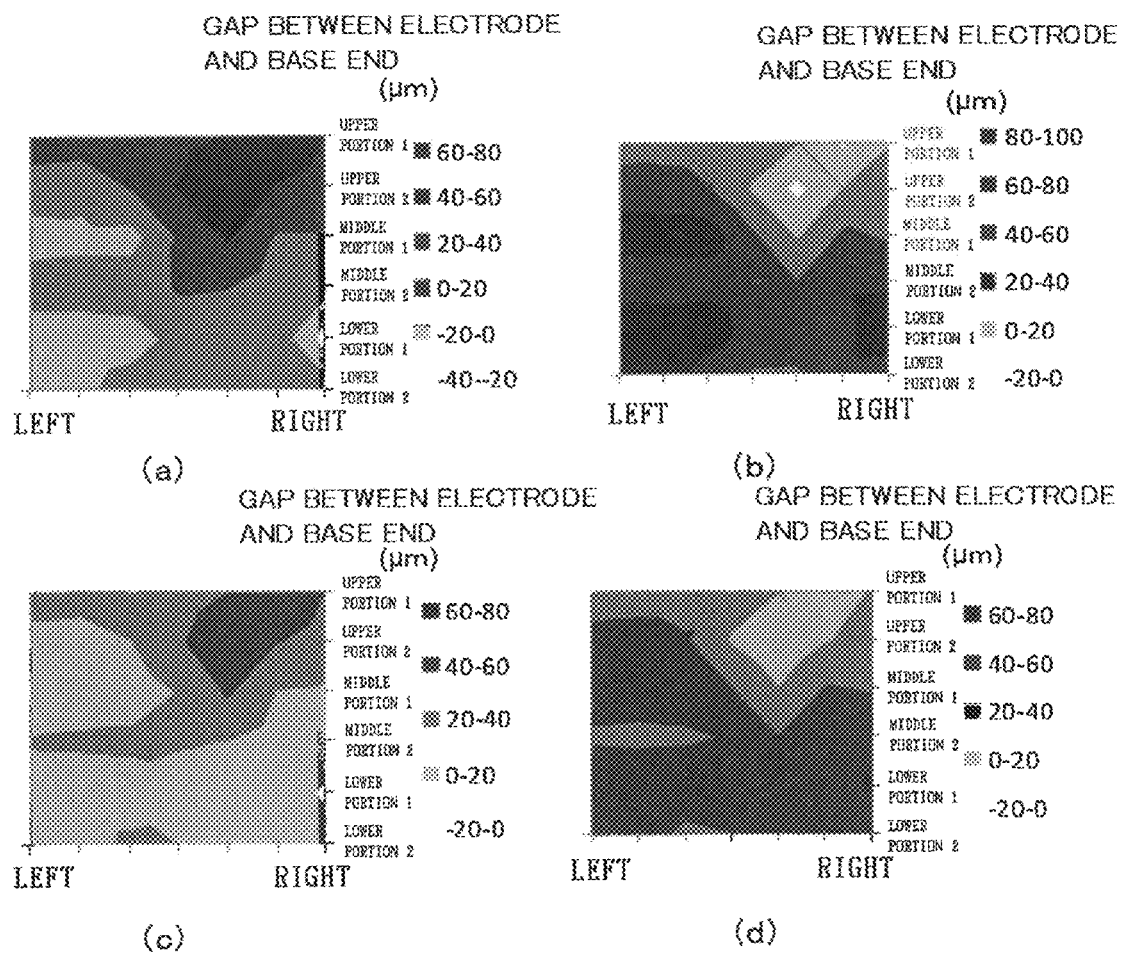
FIG. 14 is a diagram illustrating in-plane distribution of gaps between the base layer and the base electrode.

A result of mapping of an amount of the gap is illustrated in FIG. 14(a) and FIG. 14(b). A gap at an upper side (corresponding to the distance 504 at an upper side in FIG. 5) is illustrated in FIG. 14(a) and a gap at a lower side (corresponding to the distance 505 at a lower side in FIG. 5) is illustrated in FIG. 14(b). The negative value indicates that the base electrode protrudes from the base layer. When attention is paid on a position of a negative value, can be understood that the base electrode is displaced to an upper side in a lower left portion and a lower right portion of the substrate, and the base electrode is slightly displaced to a lower side in an upper right portion of the substrate.

Based on this measurement result, the position for laser processing was adjusted such that the position moves upward by 15 μm in a lower left portion of the substrate, moves upward by 25 μm in a lower right portion of the substrate and moves downward by 5 μm in an upper right portion of the substrate. Lase processing was performed at the adjusted position, and cells were manufactured through the same steps as those described above after the KOH etching step. One of the completed substrates was picked out again, and a gap was measured. In a similar manner as those described above, a gap at an upper side with respect to the base layer is illustrated in FIG. 14(c), and a gap at a lower side is illustrated in FIG. 14(d). Compared to FIG. 14(a) and FIG. 14(b), variation in the value (gap) is reduced, and the value is stabilized around 30 μm, and further, the position where the value is negative (that is, the electrode protrudes) is scarcely seen.

It should be noted that the present invention is not limited to the embodiments. The embodiments are examples, and any invention which has substantially the same configuration and provides the same operational effects as those of the technical idea recited in the claims of the present invention is incorporated into the technical scope of the present invention.

The invention claimed is:

1. A solar cell comprising a base layer and an emitter layer adjacent to the base layer which are provided on a first main surface of a semiconductor substrate, and an electrode is disposed on the base layer,
   wherein the base layer has a linear region having a length and a width on the first main surface, the linear region has a straight-line region shorter than the length of the linear region, and the straight-line region includes a region disposed at a position displaced from other straight-line regions of the linear region, and
   wherein the emitter layer has a wedge-shaped region which is convex from the emitter layer side at a boundary between the base layer and the emitter layer adjacent to the base layer, a length of a bottom portion of the wedge-shaped region is 1 μm or more and 20 μm or less, and an angle of an apex of the wedge-shaped region is 70° or more and 110° or less.

2. The solar cell according to claim 1,
   wherein a width of the base layer is 50 μm or more and 250 μm or less, and a width of the electrode is 30 μm or more and 200 μm or less.

3. A solar cell comprising a first region which has a diffusion layer on a first main surface of a semiconductor substrate, and which has a dielectric film of a predetermined film thickness on the diffusion layer, and a second region which includes a dielectric film thinner than the predetermined film thickness or which does not include the dielectric film, in which an electrode is disposed in at least part of the second region,
   wherein the second region has a linear region having a length and a width on the first main surface, the linear region has a straight-line region shorter than the length of the linear region, and the straight-line region includes a region disposed at a position displaced from extensions of other straight-line regions of the linear region,
   an amount of the dielectric film per unit area in a region where the electrode is not formed in the second region is equal to or less than 1/10 of an amount of the dielectric film per unit area in the first region, and
   wherein the first region has a wedge-shaped region which is convex from the first region side at a boundary between the second region and the first region adjacent to the second region, a length of a bottom portion of the wedge-shaped region is 1 μm or more and 20 μm or less, and an angle of an apex of the wedge-shaped region is 70° or more and 110° or less.

4. The solar cell according to claim 3,
   wherein a width of the second region is 50 μm or more and 250 μm or less, and a width of the electrode is 30 μm or more and 200 μm or less.

5. A solar cell module in which the solar cell according to claim 1 is incorporated.

6. A photovoltaic power generation system comprising the solar cell module according to claim 5.

* * * * *